(12) United States Patent
Kämpe

(10) Patent No.: US 11,050,385 B2
(45) Date of Patent: Jun. 29, 2021

(54) CLASS-C OSCILLATOR

(71) Applicant: Telefonaktiebolaget LM Ericsson (publ), Stockholm (SE)

(72) Inventor: Andreas Kämpe, Lidingö (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/642,884

(22) PCT Filed: Aug. 29, 2017

(86) PCT No.: PCT/SE2017/050863
§ 371 (c)(1),
(2) Date: Feb. 27, 2020

(87) PCT Pub. No.: WO2019/045605
PCT Pub. Date: Mar. 7, 2019

(65) Prior Publication Data
US 2020/0228060 A1 Jul. 16, 2020

(51) Int. Cl.
*H03B 5/12* (2006.01)

(52) U.S. Cl.
CPC ......... *H03B 5/1212* (2013.01); *H03B 5/1228* (2013.01); *H03B 5/1243* (2013.01); *H03B 2200/004* (2013.01); *H03B 2200/009* (2013.01)

(58) Field of Classification Search
USPC ..................................................... 331/117 R
See application file for complete search history.

(56) References Cited

U.S. PATENT DOCUMENTS

| 9,479,114 | B1* | 10/2016 | Xue ..................... H03B 5/1243 |
| 2007/0046386 | A1 | 3/2007 | Yu |
| 2013/0044838 | A1 | 2/2013 | Ding et al. |
| 2017/0257063 | A1 | 9/2017 | Martineau et al. |

FOREIGN PATENT DOCUMENTS

EP 0942531 A2 9/1999

OTHER PUBLICATIONS

International Search Report and Written Opinion for International Application No. PCT/SE2017/050863, dated May 3, 2018, 11 pages.
International Preliminary Report on Patentability for International Application No. PCT/SE2017/050863, dated Mar. 12, 2020, 7 pages.
Sheng-Lyang Jang et al., "Low-phase noise Class-C VCO with dynamic body bias," Jun. 22, 2017, pp. 847-849, Electronics Letters, vol. 53, No. 13.

(Continued)

*Primary Examiner* — Joseph Chang
(74) *Attorney, Agent, or Firm* — NDWE LLP

(57) ABSTRACT

An oscillator operable in Class-C comprises at least one set of cross-coupled transistors. A threshold voltage of the transistors is controllable by having a bias voltage applied at back-gates of the transistors. The bias voltage thereby controls a conduction angle of the transistors to enable operation of the oscillator in Class-C. There is further provided a radio transceiver comprising such an oscillator, a method of operating such an oscillator, and a controller configured to operate such an oscillator.

19 Claims, 6 Drawing Sheets

(56) References Cited

OTHER PUBLICATIONS

Xin Yang et al., "A 0.3-V power supply 2.4-GHz-band Class-C VCO IC with amplitude feedback loop in 65-nm CMOS," Dec. 2014, pp. 582-591, Analog Integrated Circuits Signal Processing, Springer.
Deng et al., "A 0.5-V, 0.05-to-3.2 GHz LC-Based Clock Generator for Substituting Ring Oscillators under Low-Voltage Condition", The Institute of Electronics, Information and Communication Engineers, vol. E95C, No. 7, Jul. 2012, pp. 1285-1296.
Supplementary European Search Report and Search Opinion, EP App. No. 17923630.2, dated Dec. 7, 2020, 8 pages.

\* cited by examiner

CLASS-C OSCILLATOR

CROSS-REFERENCE TO RELATED APPLICATIONS

This application is a National stage of International Application No. PCT/SE2017/050863, filed Aug. 29, 2017, which is hereby incorporated by reference.

TECHNICAL FIELD

Embodiments presented herein relate to an oscillator operable in Class-C, a radio transceiver device comprising such an oscillator, a method of operating such an oscillator, and a controller for operating such an oscillator.

BACKGROUND

In general terms, an electronic oscillator is an electronic circuit that produces a periodic, oscillating electronic signal, often a sine wave or a square wave. Oscillators convert direct current (DC) from a power supply to an alternating current (AC) signal. They are widely used in many electronic devices. A voltage-controlled oscillator (VCO) is an oscillator whose oscillation frequency is controlled by a voltage input. The applied input voltage determines the instantaneous oscillation frequency of the oscillator.

Class-C oscillators require a biasing control. They startup in Class-A/B, and as the amplitude increases the DC bias is reduced, finally reaching Class-C. This bias will add noise, or load, to the oscillator. In general terms, a Class-C oscillator could require an AC coupling of the gates of its cross coupled transistors (typically metal oxide semiconductor field effect transistors, MOSFETs) as well as a bias, usually provided by one or more resistors. Another approach is to connect the gates by using a secondary inductor inductively coupled to the main oscillator's inductor, and applying the bias to the center tap of the secondary inductor.

FIG. 1 schematically illustrates a traditional Class-C oscillator 10o comprising two cross-coupled transistors 120a, 120b, where 'g' denotes the gate, 'd' denotes the drain, and 's' denotes the source. FIG. 1 further illustrates the behavior of the drain voltage (denoted Vd), the gate voltage (denoted Vg), and the difference (Vd−Vg) between the drain voltage and the gate voltage for the oscillator 100.

The oscillator 100 further comprises an LC circuit 130, in turn comprising a C circuit 140 with at least one capacitor and an L circuit 150 with at least one inductor. Resistors 190a, 190b are used to bias the gates of the transistors 120a, 120b.

A current bias, denoted Itail 170, is used to control the oscillation amplitude over voltage, frequency, temperature and process variations. Any voltage fluctuation or noise on the supply voltage VCC will modulate the oscillator, resulting in spurs or phase noise. With a current bias Itail this effect is reduced.

The capacitor Ctail 180 can be regarded as capacitive parasite of current source. The capacitor Ctail 180 enables pulsed current in Class-C operation.

A DC voltage bias, denoted Vbias 160, is used to control the bias of the transistors 120a, 120b. During startup the oscillator 100 is biased in Class-A/B, and when the amplitude has become large enough, Vbias is reduced and Class-C operation is achieved.

The resistance of the resistors 190a, 190b must be large so that it does not load the LC circuit 130, as that would result in a quality factor Q is reduced. Q is thus the quality factor of the LC circuit 130, expressing the relationship between stored energy and energy. The phase noise is proportionally to $1/Q^2$, and thus a low value of Q is undesirable.

Reducing the bias of the gates to enable Class-C operation requires a low DC voltage at the gates. This increases the drain to the gate voltage and stresses the gate oxide. The oscillation amplitude must therefore be reduced as to not break down the gate oxide. This amplitude reduction has a penalty to phase noise as the phase noise is proportional to $1/\text{amplitude}^2$.

Further, the resistance of the resistors 190a, 190b must be larger than the equivalent parallel resistance, denoted Rp, of the LC circuit 130. Resistors 190a, 190b with high resistance are large and thus take up large chip area.

Such large resistors further have a large parasitic capacitive load that reduces the frequency tuning range.

AC coupling capacitors 110a, 110b are provided and are large enough to not attenuate the signal. Such large capacitors further have a large parasitic capacitive load that reduces the frequency tuning range.

The DC voltage bias must be of low noise since it is connected to the gate of the cross coupled transistors 120a, 120b. In this respect, any noise on the gate will dramatically increase the phase noise, which is due to the high gain of the gate.

In view of the above, there is a need for an improved oscillator operable in Class-C.

SUMMARY

An object of embodiments herein is to provide an oscillator operable in Class-C that does not suffer from the above identified issues, or where the above identified issues at least are mitigated, or reduced.

According to a first aspect there is presented an oscillator operable in Class-C. The oscillator comprises at least one set of cross-coupled transistors. A threshold voltage of the transistors is controllable by having a bias voltage applied at back-gates of the transistors. The bias voltage thereby controls a conduction angle of the transistors to enable operation of the oscillator in Class-C.

According to a second aspect there is presented a radio transceiver device comprises an oscillator according to the first aspect.

According to a third aspect there is presented a method of operating an oscillator according to the first aspect. The method comprises applying the bias voltage to the back-gates of the transistors so as to control the conduction angle of the transistors and thereby control the threshold voltage of the transistors.

According to a fourth aspect there is presented a controller for operating an oscillator according to the first aspect. The controller comprises processing circuitry. The processing circuitry is configured to apply the bias voltage to the back-gates of the transistors so as to control the conduction angle of the transistors and thereby control the threshold voltage of the transistors.

According to a fifth aspect there is presented a controller for operating an oscillator according to the first aspect. The controller comprises an apply module configured to apply the bias voltage to the back-gates of the transistors so as to control the conduction angle of the transistors and thereby control the threshold voltage of the transistors.

Advantageously this oscillator does not suffer from the issues identified above. Particularly, this oscillator does not need the large resistors or the large AC coupling capacitors disclosed above and therefore can keep the chip area comparatively small.

Advantageously, the back-gate bias control of the oscillator results in lower phase noise as the oscillation amplitude can be larger than in traditional oscillators. This is because the drain to gate voltage is not increased with any DC voltage bias voltage applied at the gate.

Advantageously, a tradeoff between low noise injection and loading effect does not need to be made for this oscillator.

Advantageously, biasing the back-gate reduces risk of up-converting any DC voltage bias noise to phase noise.

Advantageously this oscillator does not result in any extra parasitic load and not in any reduction in frequency tuning range.

Advantageously this oscillator does not result in any AC coupling cap.

Advantageously this oscillator does not result in any loss due to the coupling factor of a secondary inductor if a secondary inductor is used for DC control.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

The embodiments disclosed herein relate to mechanisms for enabling an oscillator to operate in Class-C. In order to obtain such mechanisms there is provided an oscillator, a radio transceiver device comprising at least one such operator, a controller configured to operate such an oscillator, and a method performed by the controller.

The inventor of the herein disclosed embodiments has realized that the threshold voltage of a transistor can be controlled with a voltage on the back-gate of the transistor. This threshold voltage control can be used to alter the operating mode of an oscillator from Class-A/B to Class-C without the use of a DC voltage bias shift of the gate voltage.

Figure 1:
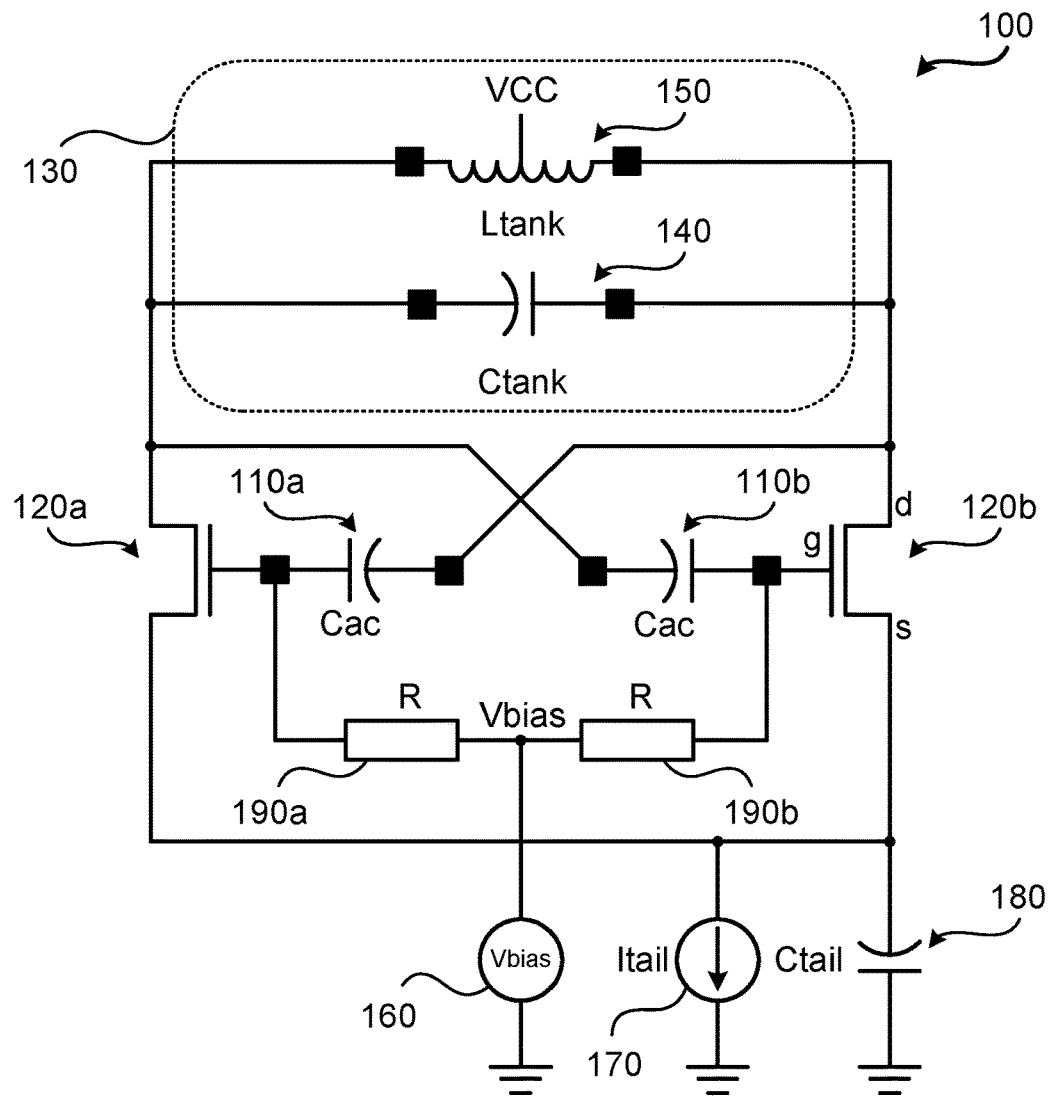
FIG. 1 schematically illustrates an oscillator according to prior art.
Figure 1:
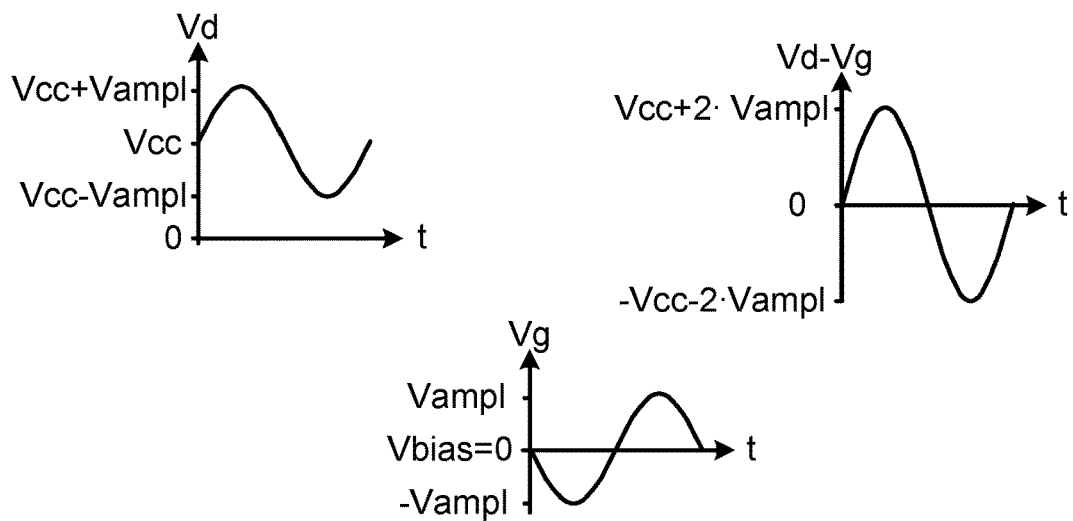
Figure 2:
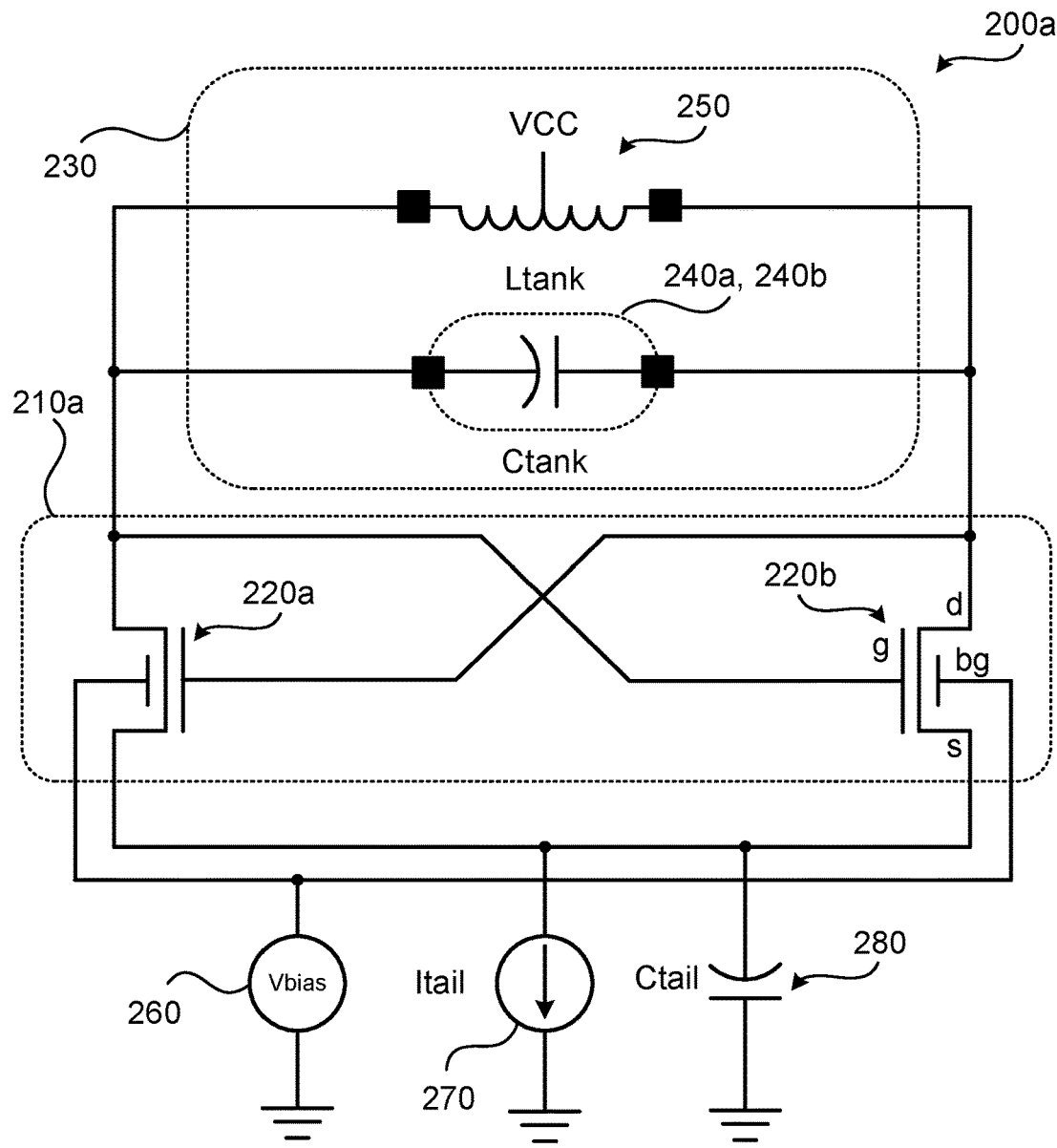
FIGS. 2, 3, 4 schematically illustrate oscillators according to embodiments.
Figure 2:
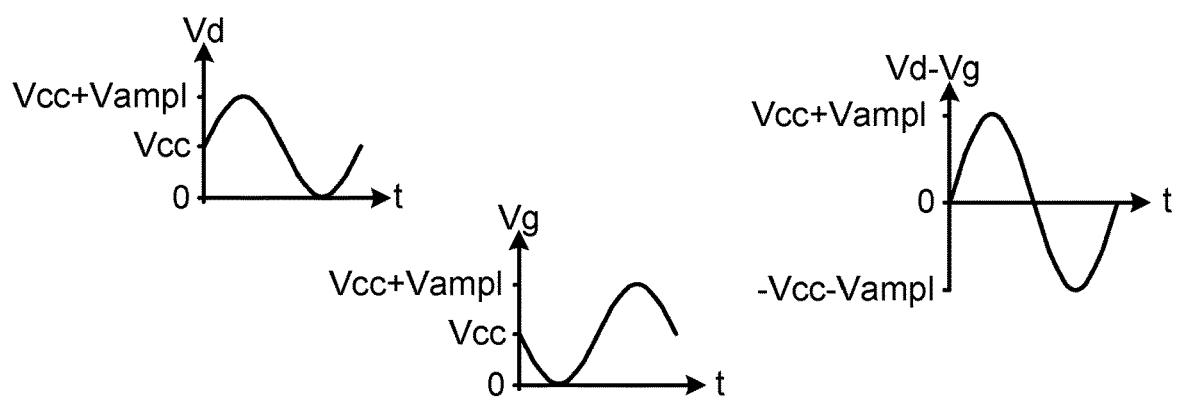
Figure 3:
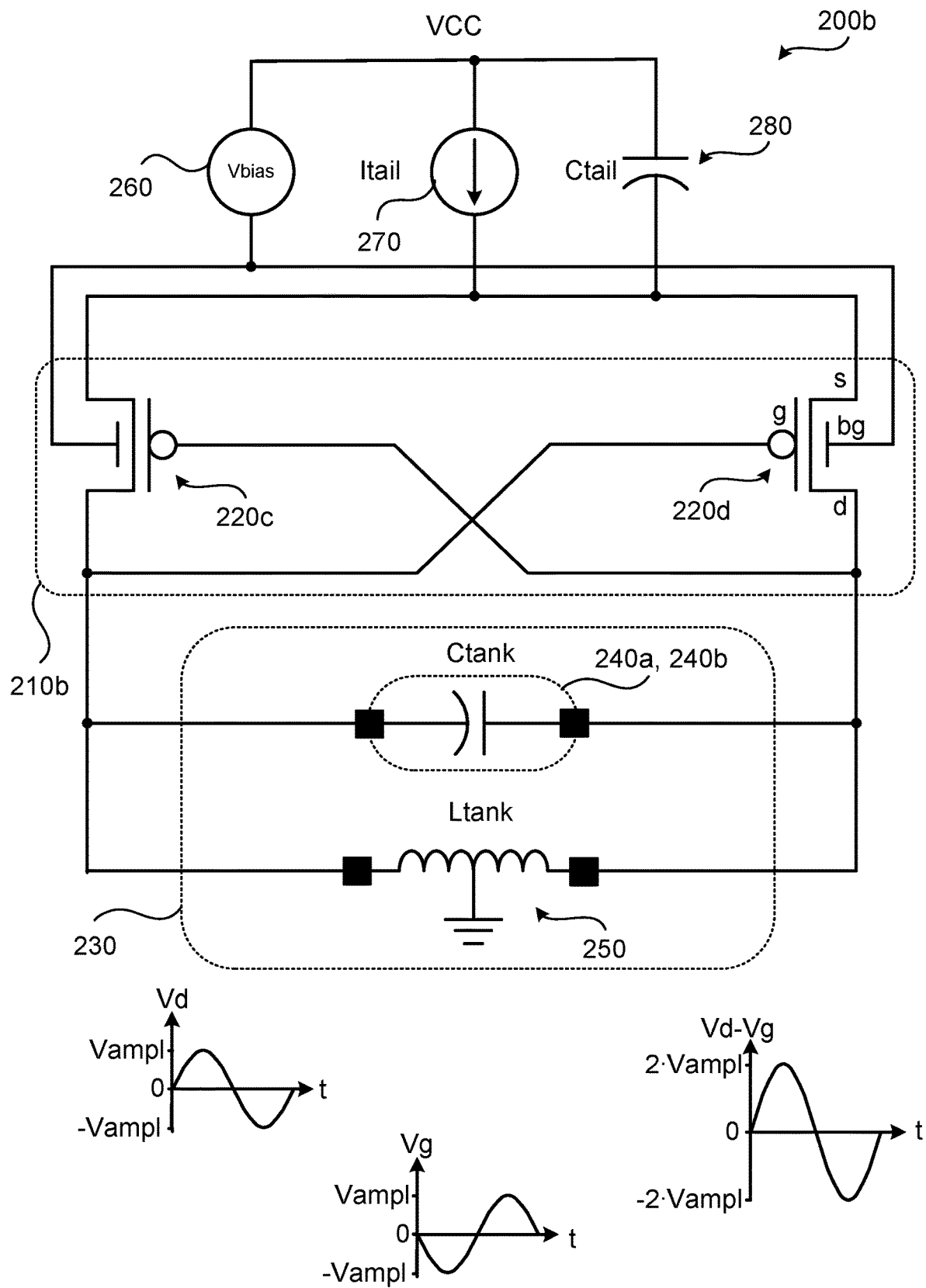

Reference is now made to FIGS. 2 and 3 illustrating example embodiments of an oscillator 200a, 200b operable in Class-C.

The oscillator 200a, 200b comprises at least one set 210a, 210b of cross-coupled transistors 220a, 220b, 220c, 220d. A threshold voltage (denoted VT) of the transistors 220a, 220b, 220c, 220d is controllable by having a bias voltage (denoted Vbias 260) applied at back-gates (denoted 'bg') of the transistors 220a, 220b, 220c, 220d. The bias voltage Vbias 26o thereby controls a conduction angle of the transistors 220a, 220b, 220c, 220d to enable operation of the oscillator 200a, 200b in Class-C.

In this respect, the conduction angle of the transistors 220a, 220b, 220c, 220d is affected by the threshold voltage VT such that the threshold voltage VT changes operation of the oscillator from Class A/B to Class-C. In more detail, during startup, the oscillator 200a, 200b is biased in Class-A/B. When the amplitude has become large enough, Vbias 260 is reduced. This reduction of the back-gate voltage increases the threshold voltage VT of the transistors 220a, 220b, 220c, 220d, and thus Class-C operation is achieved. Thereby, the conduction angle of the transistors 220a, 220b, 220c, 220d is controlled by change of the threshold voltage VT, such that when operating in Class-C less than half of a sinusoidal waveform is conducted between the drain d and source s of the transistor 220a, 220b, 220c, 220d.

The back-gate bias has no penalty in oscillation amplitude (denoted Vampl), since the drain-to-gate voltage (denoted Vdg) is not increased further by any extra DC voltage bias shift at the gate of the transistor.

In more detail, the maximum drain-to-gate voltage (denoted $Vdg^{max}$) can be expressed as:

$$Vdg^{max}=Vd-Vg=VCC+Vampl-(Vbias-Vampl)=VCC+2\cdot Vampl-Vbias,$$

where VCC denotes the (positive) supply voltage to the oscillator. In a traditional Class-C oscillator with gate bias, Vbias is reduced to almost 0 V. However, with a back-gate bias, Vbias=VCC. This yields:

$$Vdg^{max}=2\cdot Vampl.$$

This means that a higher oscillator amplitude than in traditional Class-C oscillators can be used, without risking gate oxide breakdown. A higher oscillator amplitude results in a reduced phase noise.

Further, the back-gate bias control has no bias connection to the sensitive RF nodes (as defined by the gates of the cross coupled transistors 220a, 220b, 220c, 220d). The back-gate also has low gain, and thus it is less sensitivity to bias noise compared to a DC voltage bias at the gate.

FIGS. 2 and 3 further illustrate the behavior of Vd, Vg and the Vd−Vg for the respective oscillators 200a, 200b.

The back-gate bias is especially efficient in so-called Fully Depleted Silicon On Insulator (FD SOI) technologies as the threshold voltage VT can be controlled over a large range. This is due to the back-gate can have a large voltage variation. Positive or negative bias voltage Vbias 26o can be used depending on the well structure.

Further aspects, embodiments, and examples relating to the oscillator 200a, 200b will be disclosed below.

As disclosed above, the oscillator 200a, 200b comprises at least one set 210a, 210b of cross-coupled transistors 220a, 220b, 220c, 220d. In the illustrative examples of FIGS. 2 and 3 the oscillator 200a, 200b comprises exactly one set 210a, 210b of cross-coupled transistors 220a, 220b, 220c, 220d. That is, according to an embodiment the oscillator 200a, 200b comprises only a single set 210a, 210b of transistors 220a, 220b, 220c, 220d.

The transistors 220a, 220b, 220c, 220d of the herein disclosed oscillator 200a, 200b could be either n-channel MOSFET (NMOS) transistors or p-channel MOSFET (PMOS) transistors. In the illustrative example embodiment of FIG. 2 the oscillator 200a comprises one set 210a of cross-coupled NMOS transistors 220a, 220b. That is, according to an embodiment the transistors 220a, 220b are NMOS transistors. In the illustrative example embodiment of FIG. 3 the oscillator 200b comprises one set 210b of cross-coupled PMOS transistors 220c, 220d. That is, according to another embodiment the transistors 220c, 220d are PMOS transistors.

Figure 4:
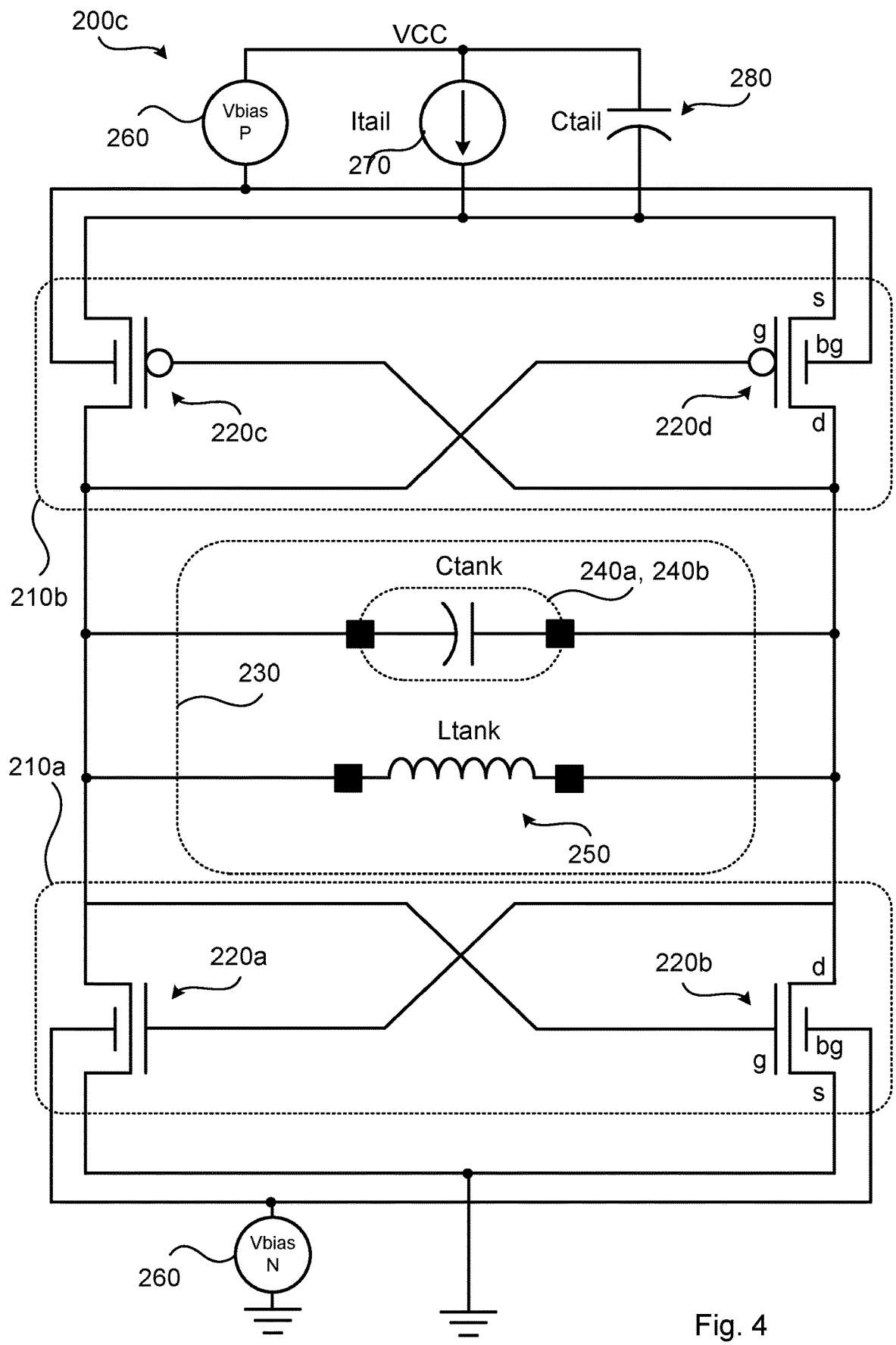
Figure 4:
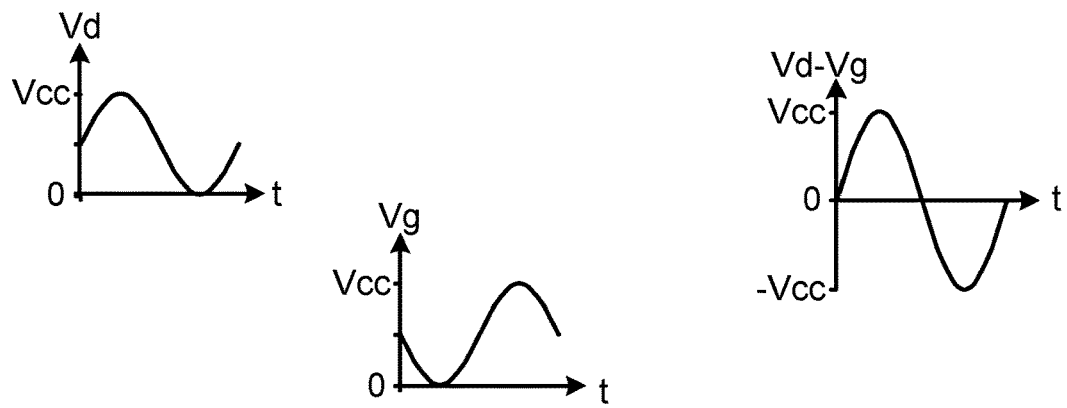

In some aspects the oscillator comprises two pairs of cross-coupled transistors, as in FIG. 4. An oscillator comprising two pairs of cross-coupled transistors is commonly referred to as a push-pull oscillator.

FIG. 4 illustrates a further example embodiment of an oscillator 200c operable in Class-C. Thus, according to an embodiment there is provided an oscillator 200c that comprises two sets 210a, 210b of transistors 220a, 220b, 220c, 220d. The oscillator 200c in other aspects operates in accordance with the oscillators 200a, 200b of FIGS. 2 and 3 as described above. Thus, for the oscillator 200c, a threshold voltage VT of the transistors 220a, 220b, 220c, 220d is controllable by having a bias voltage VbiasP, VbiasN 260 applied at back-gates 'bg' of the transistors 220a, 220b, 220c, 220d. As in the illustrative example of FIG. 4, VbiasN 260 is applied at the back-gates of transistors 220a, 220b and VbiasP 260 is applied at the back-gates of transistors 220c, 220d. The bias voltage VbiasP, VbiasN 260 thereby controls a conduction angle of the transistors 220a, 220b, 220c, 220d to enable operation of the oscillator 200a, 200b in Class-C.

In the illustrative example embodiment of FIG. 4 the oscillator 200c comprises one set 210a of cross-coupled NMOS transistors 220a, 220b and one set 210b of cross-coupled PMOS transistors 220c, 220d. That is, according to an embodiment the transistors 220a, 220b of one of the two sets (set 210a) of transistors are NMOS transistors and the transistors 220c, 220d of the other of the two sets (set 210b) of transistors are PMOS transistors.

When comparing FIGS. 2, 3, 4 to FIG. 1 it is evident that the herein disclosed oscillators 200a, 200b, 200c result in lower amplitude between drain and gate (as represented by Vd−Vg) than the traditional oscillator 100. In turn this causes less stress on the transistor 220a, 220b, 220c, 220d and therefore removes any need to back-off on the amplitude when operating the oscillators 200a, 200b, 220c in Class-C.

Continued reference is now made to FIGS. 2, 3 and 4 for disclosure of the oscillator 200a, 200b, 200c according to further embodiments.

In some aspects the oscillator 200a, 200b, 200c comprises an LC circuit 230, such as a resonant circuit, tank circuit, or tuned circuit. That is, according to an embodiment the oscillator 200a, 200b, 200c further comprises an LC circuit 230. The LC circuit 230 is connected in parallel with the at least one set 210a, 210b of transistors 220a, 220b, 220c, 220d. There could be different types of LC circuits 230. In general terms, the LC circuit 230 is an electric circuit comprising an inductor circuit 250, represented by the letter L, and a capacitor circuit 240a, 240b, represented by the letter C, connected together. The LC circuit 230 can act as an electrical resonator, an electrical analogue of a tuning fork, storing energy oscillating at the circuit's resonant frequency.

Figure 5:
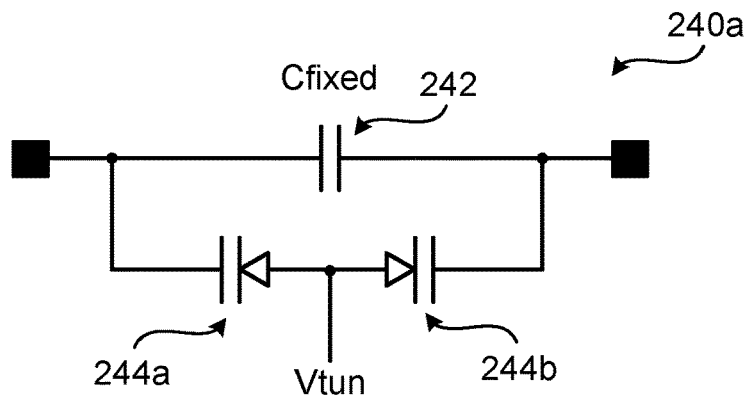
FIGS. 5 and 6 schematically illustrate capacitor circuits according to embodiments.
Figure 6:
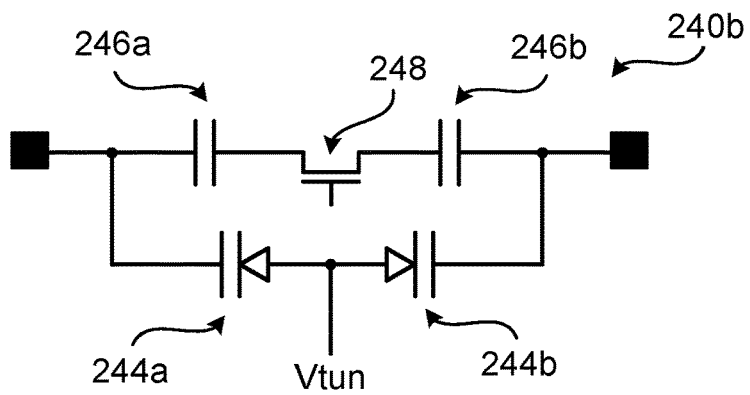

Intermediate reference is here made to FIGS. 5 and 6 illustrating capacitor circuits 240a, 240b according to embodiments. As illustrated in FIGS. 5 and 6 the capacitor circuit 240a, 240b comprises capacitors 242, 246a, 246b and varactor diodes 244a, 244b. In particular, according to an embodiment the capacitor circuit 240a, 240b of the LC circuit 230 comprises a bank of capacitors 242, 246a, 246b and at least one varactor diode 244a, 244b. The at least one varactor diode 244a, 244b is connected in parallel to the bank of capacitors 242, 246a, 246b. Further, in the embodiment of FIG. 6 the capacitors 246a, 246b are separated by a transistor 248.

The LC circuit 230 has a resonant frequency. The resonant frequency is dependent on the capacitance of the LC circuit 230. The capacitance is variable by having a tuning voltage (denoted Vtun) applied to the at least one varactor diode 244a, 244b so as to affect the resonant frequency.

Continued reference is again made to FIGS. 2, 3 and 4 for disclosure of the oscillator 200a, 200b, 200c according to further embodiments.

There could different ways to connect the LC circuit 230 to the transistors 220a, 220b, 220c, 220d. In the illustrative examples of FIGS. 2, 3, and 4 the LC circuit 230 is connected to the drains 'd' of the transistors 220a, 220b, 220c, 220d.

There could be different kinds of the oscillators 200a, 200b, 200c as disclosed above. According to an embodiment the oscillator 200a, 200b, 200c is a VCO oscillator.

Figure 7:
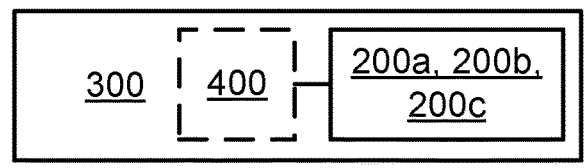
FIG. 7 is a schematic diagram of a radio transceiver device according to an embodiment.

FIG. 7 schematically illustrates a radio transceiver device 300. The radio transceiver device 300 comprises an oscillator 200a, 200b, 200c as herein disclosed. Non-limiting examples of radio transceiver devices are radio access network nodes, radio base stations, base transceiver stations, Node Bs, evolved Node Bs, g Node Bs, access points, access nodes, terminal devices, User Equipment (UE), laptop computers, tablet computers, wireless modes, network equipped vehicles, etc. The radio transceiver device 300 might further comprise a controller 400 configured to operate the oscillator 200a, 200b, 200c. Further properties of the controller 400 will be provided below.

Figure 8:
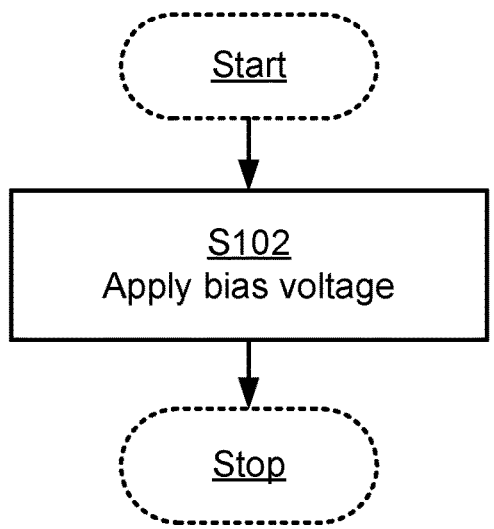
FIG. 8 is a flowchart of a method according to an embodiment.

Reference is now made to FIG. 8 illustrating a method of operating an oscillator 200a, 200b, 200c as disclosed above. The oscillator 200a, 200b, 200c is operated by the bias voltage Vbias being applied to the back-gates 'bg'. Hence:

S102: The bias voltage Vbias 260 is applied to the back-gates 'bg' of the transistors 220a, 220b, 220c, 220d so as to control the conduction angle of the transistors 220a, 220b, 220c, 220d and thereby control the threshold voltage VT of the transistors 220a, 220b, 220c, 220d.

In some aspects the method is performed by the controller 400. That is, according to an embodiment the controller 400 is configured to apply the bias voltage Vbias 26o the back-gates 'bg' as in step S102.

Figures 9, 10:
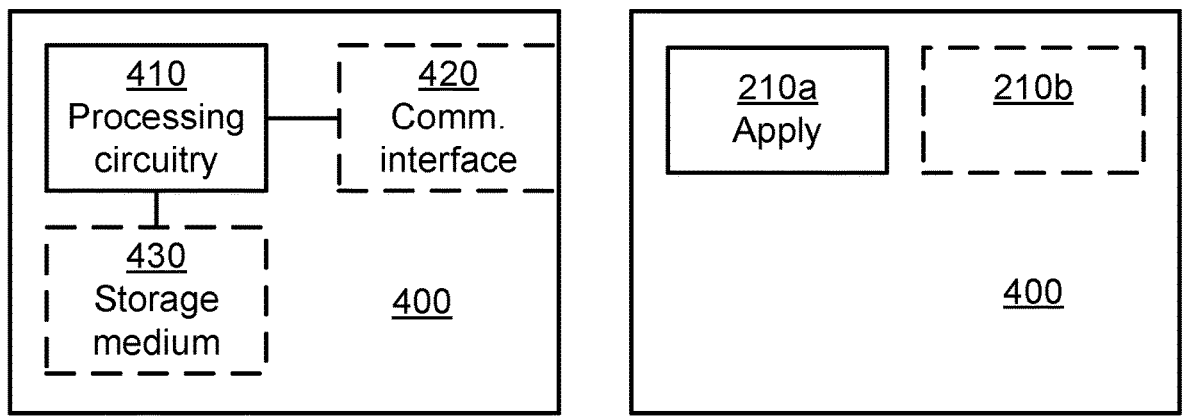
FIG. 9 is a schematic diagram showing functional units of controller according to an embodiment.
FIG. 10 is a schematic diagram showing functional modules of a controller according to an embodiment.

FIG. 9 schematically illustrates, in terms of a number of functional units, the components of a controller 400 according to an embodiment. Processing circuitry 410 is provided using any combination of one or more of a suitable central processing unit (CPU), multiprocessor, microcontroller, digital signal processor (DSP), etc., capable of executing software instructions stored in a computer program product, e.g. in the form of a storage medium 430. The processing circuitry 410 may further be provided as at least one application specific integrated circuit (ASIC), or field programmable gate array (FPGA).

Particularly, the processing circuitry 410 is configured to cause the controller 400 to perform a set of operations, as defined by step S102 disclosed above. For example, the storage medium 430 may store the set of operations, and the processing circuitry 410 may be configured to retrieve the set of operations from the storage medium 430 to cause the controller 400 to perform the set of operations. The set of operations may be provided as a set of executable instructions.

Thus the processing circuitry 410 is thereby arranged to execute methods as herein disclosed. The storage medium 430 may also comprise persistent storage, which, for example, can be any single one or combination of magnetic memory, optical memory, solid state memory or even remotely mounted memory. The controller 400 may further comprise a communications interface 420 at least configured for communications with other entities, devices, functions, and nodes, such as the radio transceiver device 300. As such the communications interface 420 may comprise one or more transmitters and receivers, comprising analogue and digital components. The processing circuitry 420 controls the general operation of the controller 400 e.g. by sending data and control signals to the communications interface 420 and the storage medium 430, by receiving data and reports from the communications interface 420, and by retrieving data and instructions from the storage medium 430. Other components, as well as the related functionality, of the controller 400 are omitted in order not to obscure the concepts presented herein.

FIG. 10 schematically illustrates, in terms of a number of functional modules, the components of a controller 400 according to an embodiment. The controller 400 of FIG. 10 comprises an apply module 410a configured to perform step S102. The controller 400 of FIG. 10 may further comprise a number of optional functional modules, such as represented by functional module 410b. In general terms, each functional module 410a-410b may in one embodiment be implemented only in hardware and in another embodiment with the help of software, i.e., the latter embodiment having computer program instructions stored on the storage medium 430 which when run on the processing circuitry makes the controller 400 perform the corresponding steps mentioned above in conjunction with FIG. 10. It should also be mentioned that even though the modules correspond to parts of a computer program, they do not need to be separate modules therein, but the way in which they are implemented in software is dependent on the programming language used. Preferably, one or more or all functional modules 410a-410b may be implemented by the processing circuitry 410, possibly in cooperation with the communications interface 420 and/or the storage medium 430. The processing circuitry 410 may thus be configured to from the storage medium 430 fetch instructions as provided by a functional module 410a-410b and to execute these instructions, thereby performing any steps as disclosed herein.

The controller 400 could either be provided as a stand-alone unit or be part of, integrated in, or collocated with, another device. According to an embodiment, as in FIG. 8, the controller 400 is part of the radio transceiver device 300. Functionality and circuitry of the controller 400 could thus be part of, integrated in, or collocated with functionality and circuitry of the radio transceiver device 300.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. An oscillator operable in Class-C, the oscillator comprising:
   at least one set of cross-coupled transistors without use of coupling capacitors between respective drain and gate cross-coupled connections;
   wherein a threshold voltage of the cross-coupled transistors is controllable by having a bias voltage applied at back-gates of the cross-coupled transistors and no bias voltage applied to gates of the cross-coupled transistors, the bias voltage at the back-gates thereby controlling a conduction angle of the transistors to enable operation of the oscillator in Class-C operation.

2. The oscillator according to claim 1, wherein the oscillator comprises only a single set of cross-coupled transistors.

3. The oscillator according to claim 2, wherein the cross-coupled transistors are n-channel metal oxide semiconductor (NMOS) transistors.

4. The oscillator according to claim 2, wherein the cross-coupled transistors are p-channel metal oxide semiconductor (PMOS) transistors.

5. The oscillator according to claim 1, wherein the oscillator comprises two sets of cross-coupled transistors.

6. The oscillator according to claim 5, wherein transistors of one set of the two sets of cross-coupled transistors are n-channel metal oxide semiconductor (NMOS) transistors and transistors of second set of the two sets of cross-coupled transistors are p-channel metal oxide semiconductor (PMOS) transistors.

7. The oscillator according to claim 1, further comprising:
   an inductor-capacitor (LC) circuit, wherein the LC circuit is connected in parallel with the at least one set of cross-coupled transistors.

8. The oscillator according to claim 7, wherein the LC circuit comprises a bank of capacitors and at least one varactor diode connected in parallel to the bank of capacitors.

9. The oscillator according to claim 8, wherein the LC circuit has a resonant frequency, the resonant frequency being dependent on capacitance of the LC circuit, and wherein the capacitance is variable by having a tuning voltage applied to the at least one varactor diode so as to vary the resonant frequency.

10. The oscillator according to claim 7, wherein the LC circuit is connected to drains of the cross-coupled transistors.

11. The oscillator according to claim 1, wherein the oscillator is a voltage-controlled oscillator.

12. The oscillator according to claim 1, wherein the oscillator is implemented in a radio transceiver.

13. A method of operating an oscillator having a set of cross-coupled transistors coupled to drive a resonance circuit and without use of coupling capacitors between respective drain and gate cross-coupled connections of the cross-coupled transistors, the method comprising:
   applying a bias voltage to back-gates of the cross-coupled transistors and no bias voltage applied to gates of the cross-coupled transistors, wherein the bias voltage at the back-gates to control threshold voltage of the cross-coupled transistors, in order to control conduction angle of the cross-coupled transistors to operate the oscillator in Class-C operation.

14. A controller for operating an oscillator having a set of cross-coupled transistors coupled to drive a resonance circuit and without use of coupling capacitors between respective drain and gate cross-coupled connections of the cross-coupled transistors, the controller comprising processing circuitry configured to:

apply a bias voltage to a back-gates of the cross-coupled transistors and no bias voltage applied to gates of the cross-coupled transistors, wherein the bias voltage at the back-gates to control threshold voltage of the cross-coupled transistors, in order to control conduction angle of the cross-coupled transistors to operate the oscillator in Class-C operation.

15. The controller according to claim 14, wherein the resonance circuit is an inductor-capacitor (LC) circuit coupled to output nodes of the cross-coupled transistors.

16. The controller according to claim 14, wherein the resonance circuit is an inductor-capacitor (LC) circuit coupled to output nodes of the cross-coupled transistors and arranged to operate as a parallel tank circuit.

17. The controller according to claim 16, wherein the resonance circuit includes one or more varactor diodes and wherein a tuning voltage applied to one or more varactor diodes varies a capacitance of the LC circuit to vary a resonant frequency of the LC circuit.

18. The controller according to claim 14, wherein the resonance circuit is an inductor-capacitor (LC) circuit arranged in parallel and coupled across drain nodes of the cross-coupled transistors which are n-channel metal oxide semiconductor transistors.

19. The controller according to claim 14, wherein the resonance circuit is an inductor-capacitor (LC) circuit arranged in parallel and coupled across drain nodes of the cross-coupled transistors which are p-channel metal oxide semiconductor transistors.

\* \* \* \* \*